(12) United States Patent
Bardsley et al.

(10) Patent No.: US 8,368,576 B2
(45) Date of Patent: Feb. 5, 2013

(54) PIPELINED ANALOG-TO-DIGITAL CONVERTER

(75) Inventors: Scott Bardsley, Gibsonville, NC (US); Franklin Murden, Roan Mountain, TN (US); Eric Siragusa, San Diego, CA (US); Peter Derounian, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 96 days.

(21) Appl. No.: 13/095,235

(22) Filed: Apr. 27, 2011

(65) Prior Publication Data
US 2012/0274497 A1    Nov. 1, 2012

(51) Int. Cl.
  *H03M 1/34* (2006.01)
(52) U.S. Cl. .......................... 341/162; 341/144; 341/172

(58) Field of Classification Search .......... 341/161–162, 341/172
See application file for complete search history.

(56) References Cited

U.S. PATENT DOCUMENTS

| | | | |
|---|---|---|---|
| 7,652,611 B2 * | 1/2010 | Elliott et al. | 341/161 |
| 7,671,779 B1 * | 3/2010 | Guidry et al. | 341/172 |
| 2011/0084861 A1 * | 4/2011 | Murden et al. | 341/118 |
| 2011/0309962 A1 * | 12/2011 | Hernes et al. | 341/155 |

* cited by examiner

*Primary Examiner* — Khai M Nguyen
(74) *Attorney, Agent, or Firm* — Kenyon & Kenyon LLP

(57) ABSTRACT

An analog-to-digital converter includes a plurality of sequentially cascaded stages, each stage including an amplifier and four copies of a circuit block including a flash and capacitors, in which the four copies of the circuit block operate interleavingly in a respective sample mode, pre-gain mode, gain mode, and reset mode of the circuit block, the copies of the circuit block in the sample mode, pre-gain mode, and reset mode are decoupled from the amplifier, and the copy of the circuit block in the gain mode is coupled to the amplifier to produce an output for a next following stage.

22 Claims, 15 Drawing Sheets

PIPELINED ANALOG-TO-DIGITAL CONVERTER

FIELD OF THE INVENTION

The present invention is generally directed to pipelined analog-to-digital converters (ADCs). In particular, the present invention is directed to an ADC that includes a single amplifier selectively coupled to one of a plurality of copies of a circuit block in which each copy includes capacitors in different state of charge.

BACKGROUND INFORMATION

FIG. 1 illustrates an exemplary N-stage pipelined ADC 100 that is known in the art. The pipelined ADC 100 may include a number of cascaded multiplying digital-to-analog converter (MDAC) stages 102-108 and a control and correction logic circuit 110. The pipeline ADC 100 may receive an analog input signal $v_{in}$ at an input of the first stage 102 and eventually produce a digital output $D_{out}$ that corresponds to $v_{in}$. In operation, each stage of the pipelined ADC may be responsible for converting a portion of the input signal $v_{in}$ into a digital code and pass along a remaining portion of the input signal to a next stage of conversion. For example, stage i 106 may receive an input signal $V_{i-1}$ and convert the input signal into an n-bit digital code Di and output a remaining portion $V_i$ of the input $V_{i-1}$ to the next stage i+1. The n-bit digital code Di may be a one-bit digital code, or a digital code of more than one bit. The control and correction logic 110 may receive the digital codes D1, D2, ..., Di, ..., Dn sequentially through a series of clock cycles (not shown) and assemble these digital codes into the digital output $D_{out}$. The assembling may include inserting appropriate delays and bit shifts. Further, the control and correction login 110 may correct digital errors.

FIG. 2 illustrates an exemplary MDAC stage 200. The exemplary stage (stage k) may include an analog-to-digital converter (ADC) 202, a digital-to-analog converter (DAC) 204, a summing node 206, and an amplifier 208. The MDAC stage 200 may receive an input signal $v_{k-1}$ from the output of a previous stage which may correspond to a remaining portion of the input signal $V_{k-1}$ after k−1 MDAC stages of processing. When k=1 at stage one, the input signal may be the analog input to the pipelined ADC. The input signal $v_{k-1}$ may be, via a first signal path, fed to the ADC 202 for converting $v_{k-1}$ into a digital code $D_k$ which may be provided to the control and correction logic circuit 110. The input signal $v_{k-1}$ may also be, via a second signal path, fed to a first input of the summing node 206. The digital code $D_k$ may also be fed to the DAC 204 which may convert the digital code $D_k$ into an analog signal $V_{Dk}$ that represents an analog value for the digital code $D_k$. The analog signal $V_{Dk}$ may be fed into a second input of the summing node 206 so that the summing node 206 may subtract the analog signal $V_{Dk}$ from the input signal $v_k$ to form a difference signal. The difference signal may be scaled by the amplifier 208 to produce a remaining output $V_k$ for a following MDAC stage.

FIG. 3 illustrates an exemplary schematic of the MDAC stage as shown in FIG. 2. The illustrated MDAC stage is for one-bit conversion. However, multiple bit MDAC stages may be similarly constructed. Referring to FIG. 3, the MDAC stage circuit 300 may include a 1-bit flash ADC 302, a DAC 306, an amplifier 312, an input capacitor 310, a feedback capacitor 316, and switches 308, 314, 318. The flash 302 may include a comparator circuit 304 that may include a first input for receiving an input signal $V_{k-1}$ and a second input being coupled to a reference. The comparator 304 may compare the input signal $V_{k-1}$ with the reference and generate a one-bit digital code D0 based on the comparison. For example, the comparator 304 may produce a "1" if the input signal $V_{k-1}$ is higher than the reference or a "0" if the input signal $V_{k-1}$ is lower than the reference. The digital code D0 may be provided to a control and correction logic and to a DAC 306. The control and correction circuit, as discussed above, may assemble digital codes from all of the stages to form the eventual digital output for the pipelined ADC. The DAC 306 may convert the digital code D0 into an analog signal $V_{D0}$ which may be supplied via the input capacitor 310 to a summing node SN. The DAC 306 may further include one or more capacitors (not shown) and switches (not shown) to control these DAC capacitors. A first input of the amplifier 312 may be coupled to the summing node SN, and a second input may be coupled to a reference voltage. The feedback capacitor 316 may be coupled from the summing node to an output of the amplifier 312. Further, the input signal $V_{k-1}$ may be, via switch 308, selectively connected to the input capacitor 310, the summing node may be, via switch 314, selectively connected to a reference, and the output $V_k$ may be, via switch 318, selectively connected to a reference.

FIG. 4 further illustrates an exemplary schematic of a comparator 400. The exemplary comparator 400 may include a pre-amplifier 402 and a latch 404 coupled to an output of the pre-amplifier 402. The pre-amplifier 402 may include a first input for receiving the input signal $V_{k-1}$ and a second input being coupled to a reference. The pre-amplifier 402 may amplify a difference signal between the input $V_{k-1}$ and the reference, and supply the amplified difference signal to the latch 404. The latch 404 may be a latch circuit commonly known in the art that operates according to a clock to produce differential outputs Vout+ and Vout−. In operation, the latch 404 may receive the difference signal from the pre-amplifier and operate according to the clock. The clock supplied to the latch 404 may be composed of a series of clock cycles that each further includes a first high phase ("1") and a second low phase ("0"). Thus, when the clock is a high phase, the latch 404 may operate to keep the latch from regenerating so that the outputs Vout+ and Vout− may maintain a difference. When the clock is in a low phase, an internal positive feedback loop in the latch 404 may force the differential outputs Vout+ and Vout− to transition into a stable state depending on the differential input. The transition is commonly called regeneration whose temporal length may be dependent on the voltage difference between Vout+ and Vout−. Thus, a smaller voltage difference may need longer time or longer regeneration time to achieve a stable state, and a larger voltage difference may need shorter time or shorter regeneration time.

During operation, stages of the pipelined ADC as illustrated in FIG. 3 may operate according to an ADC clock (ADC CLK) as illustrated in FIG. 5. The ADC clock may include a sequence of clock cycles such as C1, C2. Each clock cycle may further include a first phase P1 and a second P2 in which P1 and P2 may indicate a respective low level and high level of the ADC clock. During the first phase P1 of the ADC clock, switches 308, 314, 318 may be engaged so that the input signal $V_{k-1}$ may be charged to the input capacitor 310, and the feedback capacitor 316 may be discharged. This first phase is also called the sample phase as the input capacitor samples input signal. During the sample phase, the comparator 304 may be in a tracking state under which the latch in the comparator is kept from regenerating. Also, during the sample phase, a switch in the DAC (not shown) may be disengaged such that the DAC is decoupled from the input capacitor 310. In an alternative implementation, DAC 306 may include one or more capacitors (not shown) that are separate from capacitor 310. These separate capacitors may include a first end coupled to the summing node (SN) and a second end coupled to a reference (0V) during the sample phase.

Following the sample phase, the ADC clock may enter a second phase of the clock cycle called a gain phase. During the gain phase, switches 308, 314, 318 may be disengaged, and internal switches (not shown) in DAC 306 may be engaged so that the DAC 306 may be coupled to the input capacitor 310. Thus, during the gain phase, the latch in the comparator 304 may be switched on to start regenerating. Further, the charge on the input capacitor 310 minus the output from DAC 306 may be transferred, via the feedback capacitor 316, to the output. The capacitance ratio between the feedback capacitor 316 and the input capacitor 310 may determine a gain ratio at the output $V_k$. However, as discussed above, the regenerating at the latch may take time $t_{reg}$ whose length depends on the output voltage difference at the latch. Further, the capacitors in DAC 306 may also take time $t_{dr}$ to be driven to proper charges. The combined time $t_{reg}+t_{dr}$ occurs during the gain phase and reduces the stable output time $t_g$ of the output signal Vout.

In other designs, other considerations may further reduce the time $t_g$ of stable output in addition to $t_{reg}$ and $t_{dr}$. For example, U.S. patent application Ser. No. 12/578,057 ('057 Application) of the assignee of the present application describes four input channels that share a single amplifier and a single feedback capacitor. Thus, following the gain phase of another channel (which may occur during a sample phase of the current channel), the shared feedback capacitor and DAC capacitors may need to be discharged prior to being used by the current channel. Since the feedback capacitor 316 is directly coupled to the output of the amplifier 312, the output of the amplifier 312 may need to clamp to 0V. This reset operation also occurs during the gain phase and may take additional time $t_{rs}$ away from the amplifier gain settling to a stable output.

Larger and faster drivers may reduce $t_{reg}$, $t_{dr}$, and $t_{rs}$. However, larger and faster drivers may require a larger amplifier and a large comparator which consume more power.

DETAILED DESCRIPTION

Therefore, there is a need to effectively maximize the gain phase without increasing the size and power consumption of the amplifier.

Embodiments of the present invention include an analog-to-digital converter that includes a plurality of sequentially cascaded stages. Each stage further includes an amplifier and four copies of a circuit block including a flash and capacitors, in which the four copies of the circuit block operate interleavingly in a respective sample mode, pre-gain mode, gain mode, and reset mode of the circuit block, the copies of the circuit block in the sample mode, pre-gain mode, and reset mode are decoupled from the amplifier, and the copy of the circuit block in the gain mode is coupled to the amplifier to produce an output for a following stage.

Figure 1:
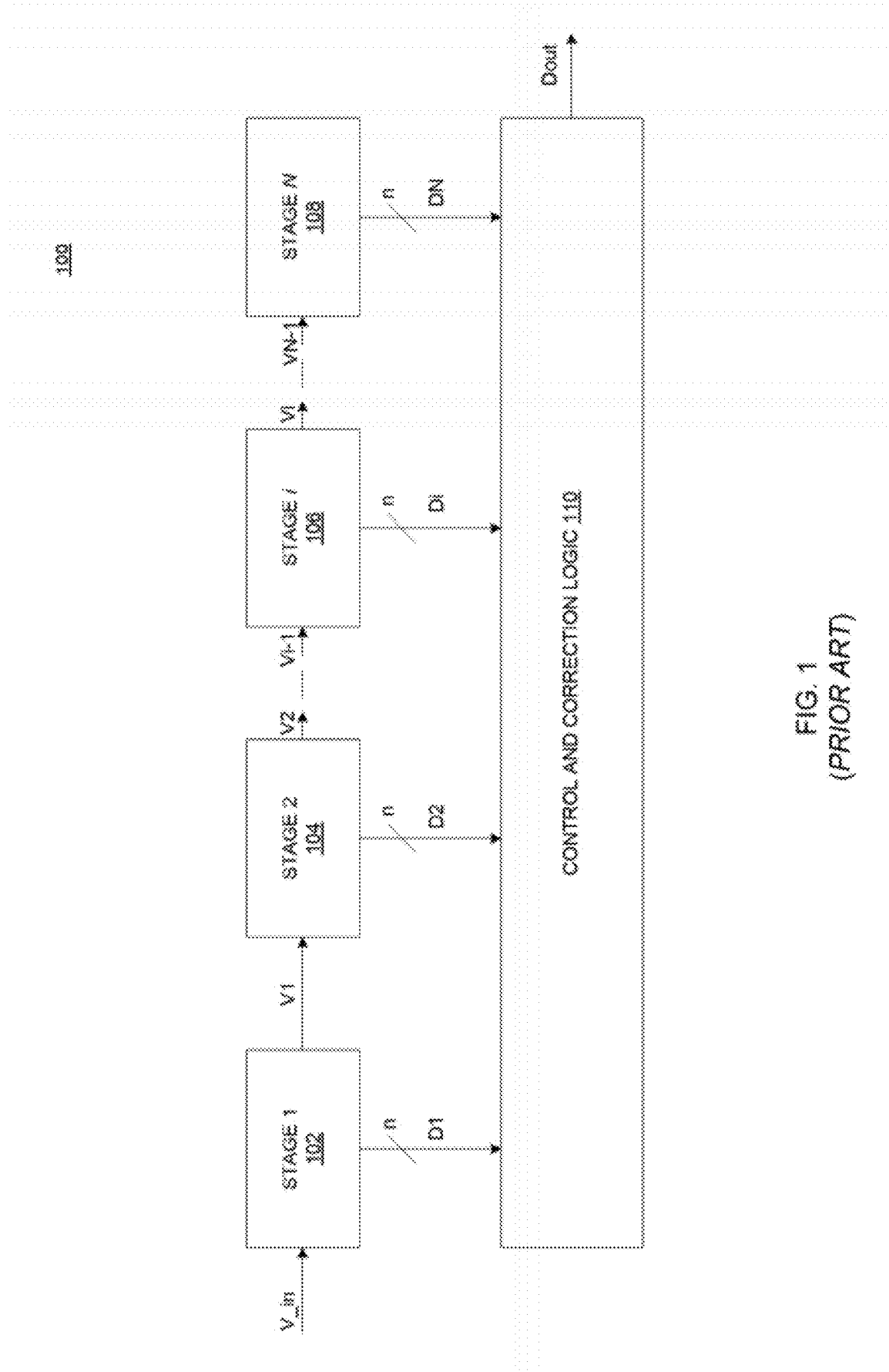
FIG. 1 illustrates an exemplary N-stage pipelined ADC.
Figure 2:
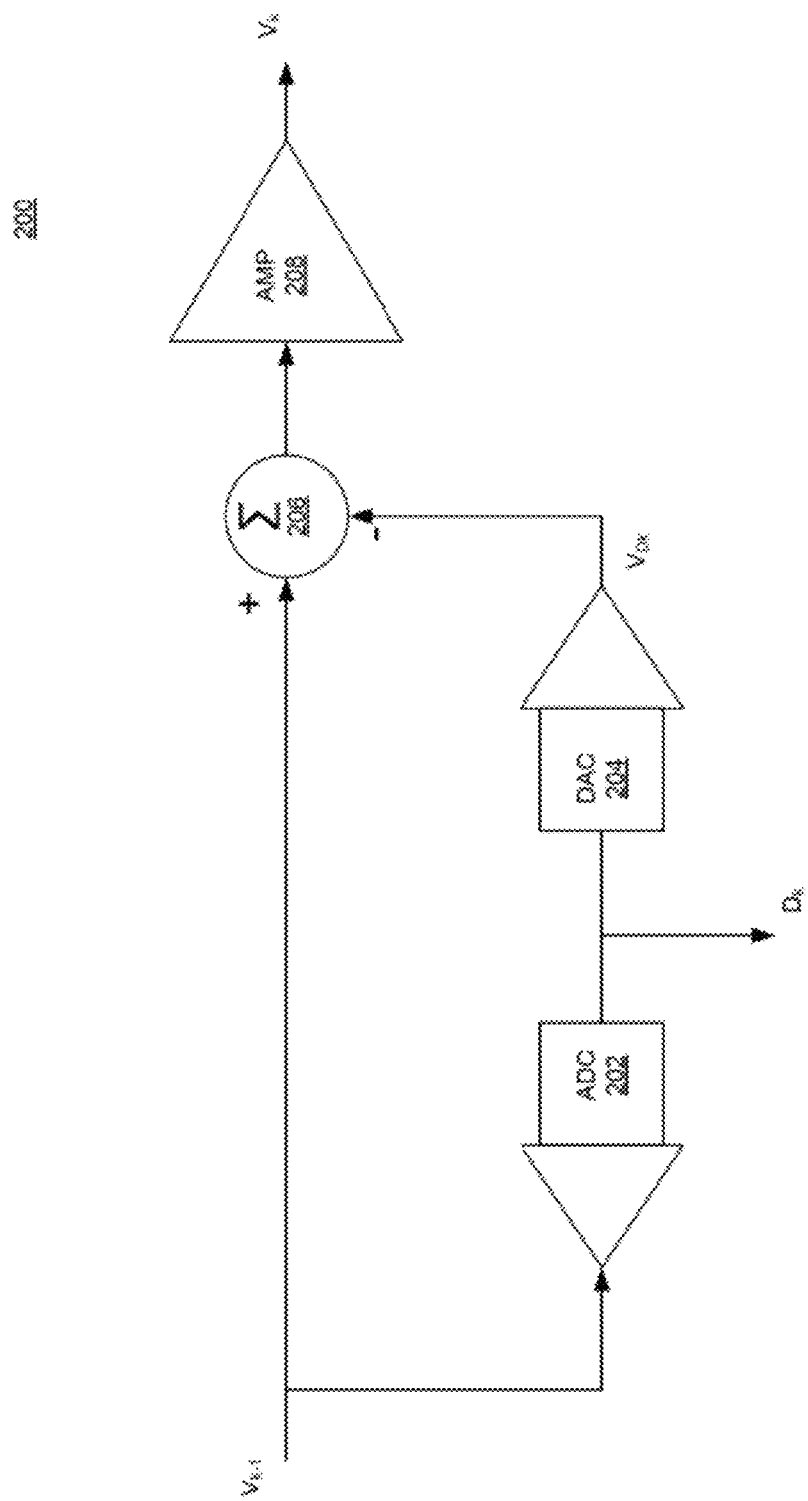
FIG. 2 illustrates an exemplary MDAC stage.
Figure 3:
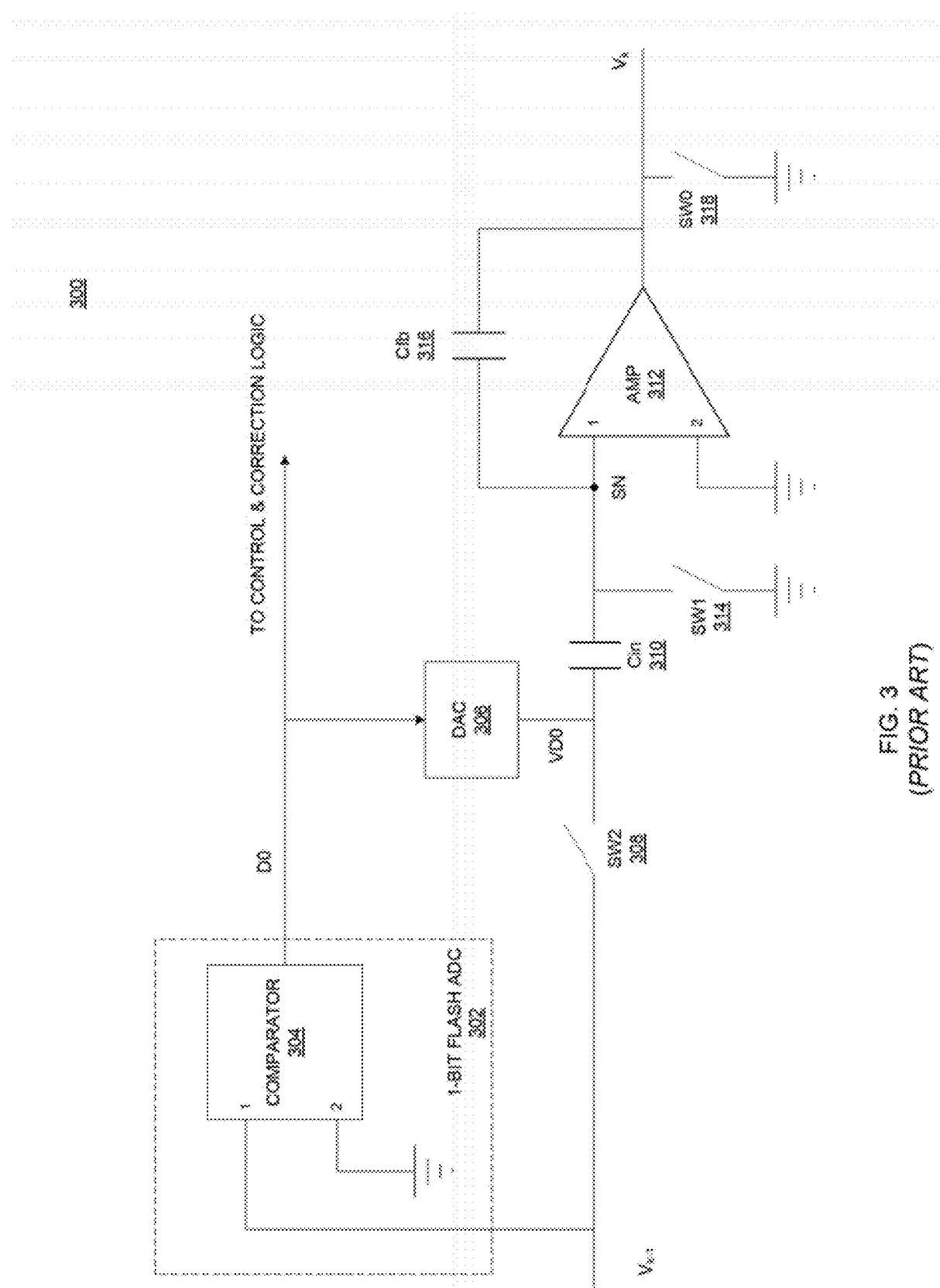
FIG. 3 illustrates an exemplary schematic of the MDAC stage.
Figure 4:
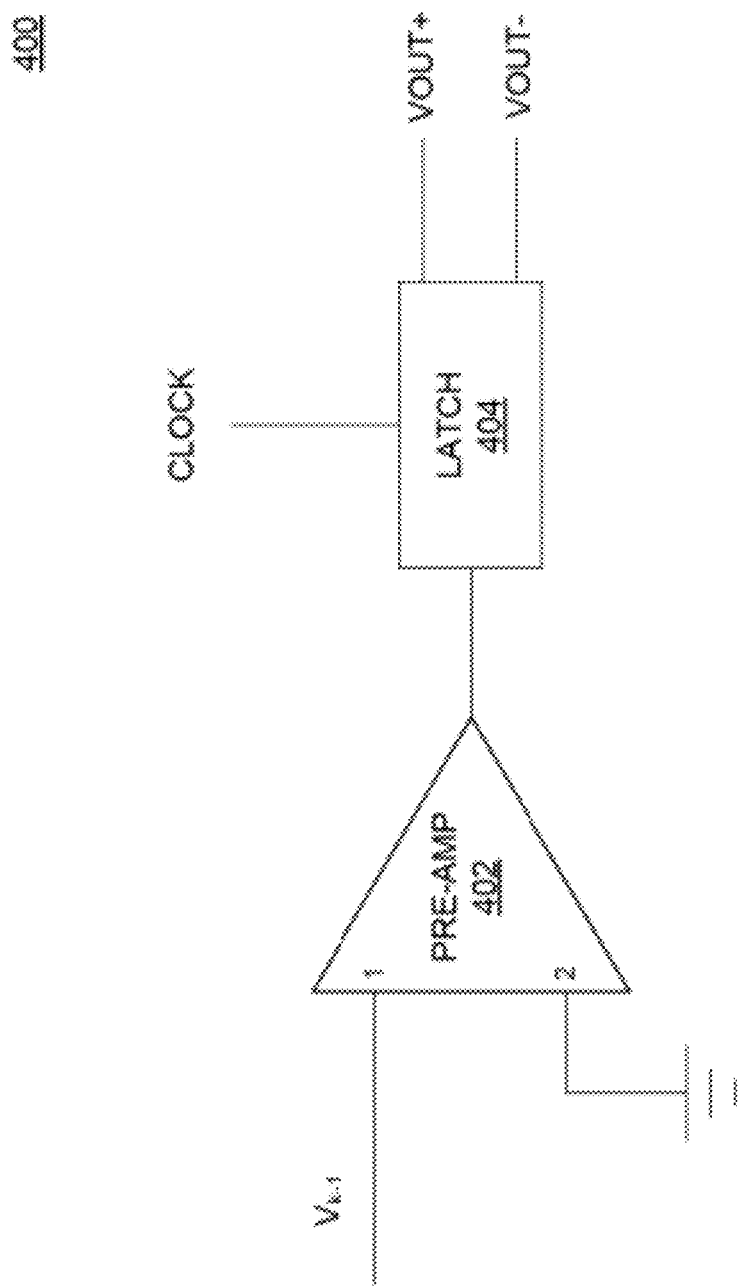
FIG. 4 illustrates an exemplary schematic of a comparator.
Figure 5:
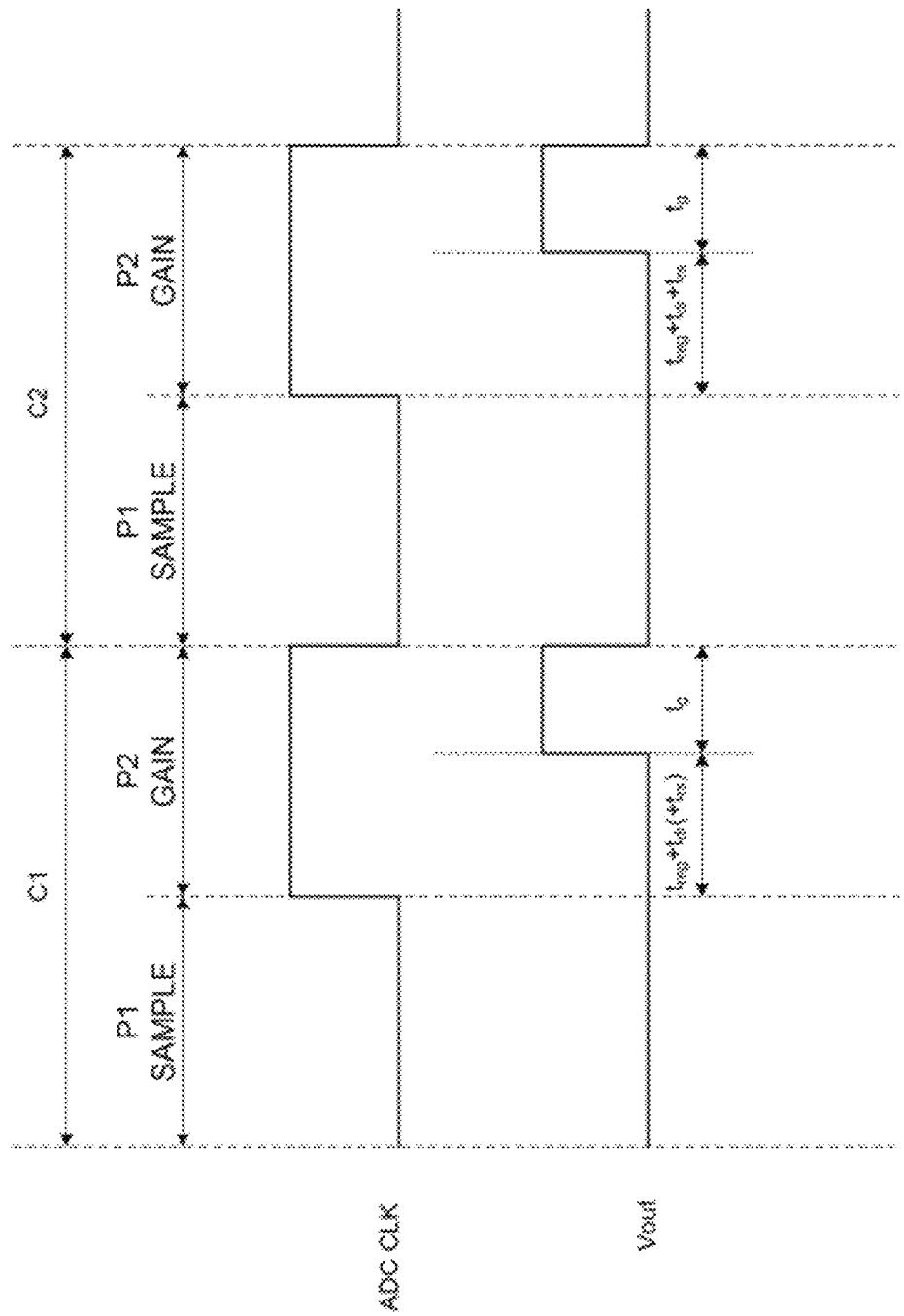
FIG. 5 illustrates an exemplary ADC clock.
Figure 6:
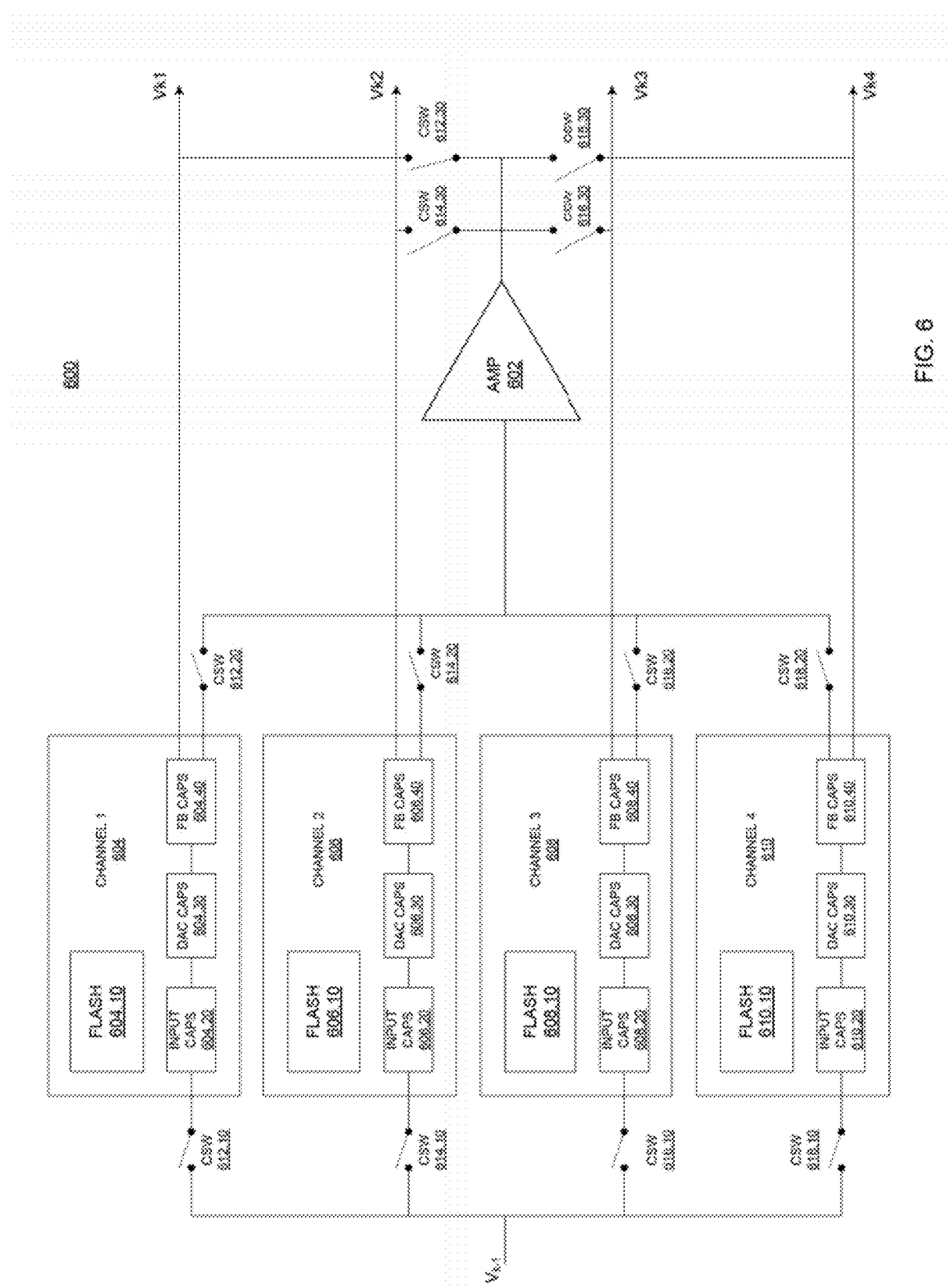
FIG. 6 illustrates an MDAC stage of a pipelined ADC according to an exemplary embodiment of the present invention.

FIG. 6 illustrates an MDAC stage 600 of a pipelined ADC according to an exemplary embodiment of the present invention. The MDAC may include an amplifier 602 and four channels (channel 1-4) 604, 606, 608, 610. Each channel may be a copy of a same circuit block operating at a specific mode. Each channel may respectively include a flash (604.10, 606.10, 608.10, 610.10), input capacitors (604.20, 606.20, 608.20, 610.20), DAC capacitors (604.30, 606.30, 608.30, 610.30), and feedback capacitors (604.40, 606.40, 608.40, 610.40). Four set of switches 612, 614, 616, 618 may be selectively engaged to couple the channels to input signal $V_{k-1}$ or to the amplifier 602. When a channel is coupled to the amplifier 602, the coupled channel and amplifier 602 may form a particular MDAC such as the one illustrated in FIG. 3.

Figure 8:
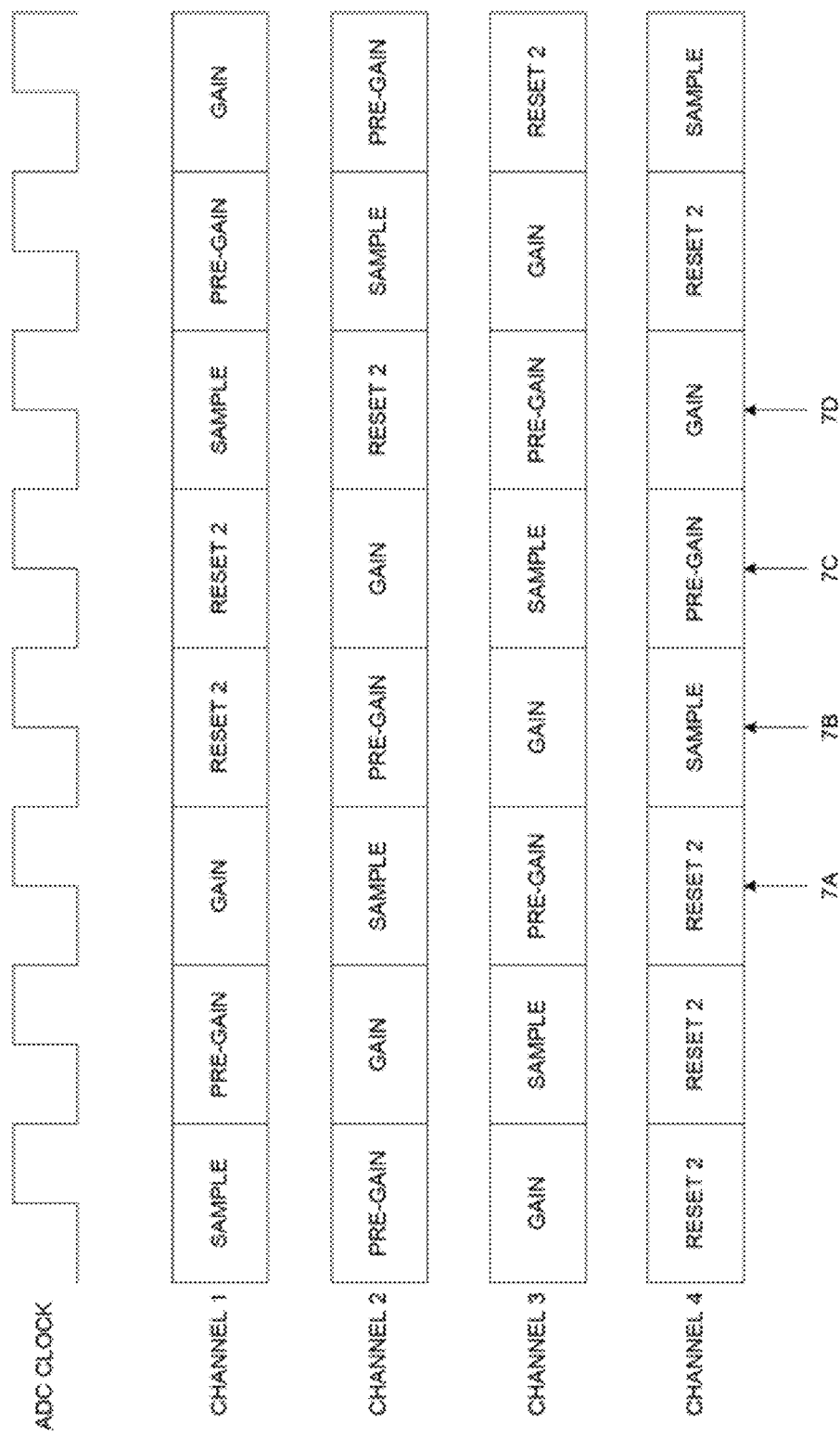
FIG. 8 illustrates an ADC clock and corresponding operation modes at each channel according to an embodiment of the present invention.

During operation, in each clock cycle, the four channels 604, 606, 608, 610 may operate interleavingly in one of a sampling mode, a pre-gain mode, a gain mode, and a reset mode of the circuit block. FIG. 8 illustrates the interleaving operation modes of the four channels with respect to an ADC clock. For example, as illustrated in FIG. 8, during the first clock cycle, channel 1 may operate in the sample mode, channel 2 may run in the pre-gain mode, channel 3 may run in the gain mode, and channel 4 may run in the reset mode. It should be noted that the reset mode may also be a state of un-used mode while capacitors reset is accomplished during other modes. The un-used mode may be inserted for randomization purpose. During the second clock cycle, channel 1 operates in the pre-gain mode, channel 2 operates in the gain mode, channel 3 operates in the sample mode, and channel 4 operates in the reset mode. As shown in FIG. 8, the four channels operate interleavingly so that each of the four channels operates in one respective modes during a clock cycle. Further, with respect to a particular channel, the particular channel may sequence through sample, pre-gain, and gain in order while a random number of reset modes may be inserted after the gain mode.

In the following, the operation of a channel in different modes is discussed. For convenience and clarity, the operation of channel 604 is discussed in light of the sample, pre-gain, gain, and reset modes. However, same principles may be applied to other channels. When channel 604 operates in the sample mode, the switch 612.10 may be engaged and the switches 612.20, 612.30 may be disengaged so that the input signal $V_{k-1}$ may be supplied to channel 604 while channel 604 is not coupled to amplifier 602. Through internal switching within channel 604 (discussed below in conjunction with FIGS. 7A-7D), the input signal $V_{k-1}$ may be supplied to the input capacitors 604.20 so that the input capacitors may be charged with the input signal $V_{k-1}$. The input signal $V_{k-1}$ may also be supplied to flash 604.10 in the channel so that an input buffer (not shown) in the flash may sample the input signal $V_{k-1}$. During the same sample mode, DAC capacitors 604.30 and feedback capacitors 604.40 may be discharged or reset to 0V or substantially close to 0V. Since the DAC capacitors 604.30 and feedback capacitors 604.40 are reset during the sample mode, they may not need to be reset during the gain mode to take time away from the gain settling. Resetting the feedback capacitors 604.40 during the sample mode when the feedback capacitors 604.40 are not coupled to the amplifier 602 also has other advantages. For example, since the feedback capacitors 604.40 are decoupled from the amplifier 602, the reset of the feedback capacitors 604.40 is independent from the reset of the amplifier output node. Therefore, the amplifier output node may not need to be thoroughly reset to clamp to 0V, which may also provide more time to amplifier settling during gain modes.

When channel 604 operates in the pre-gain mode, switches 612.10, 612.20, 612.30 may be all disengaged so that channel 604 is not coupled to the input signal $V_{k-1}$ or the amplifier 602. During the pre-gain mode, a comparator in the flash 604.10 may regenerate and drive an internal switch to couple the DAC capacitors 604.30 to a first end of the input capacitors 604.20. Further, a second end of the input capacitors may be coupled to a reference voltage such as a ground reference. Thus, the pre-gain mode allows an entire clock cycle for the comparator to regenerate—which may significantly relax the constraints on the comparator regeneration time. For example, since the regeneration time is relaxed, the requirement of the current to drive the regeneration and DAC capacitors may also be relaxed. Also, since the DAC capacitors 604.30 and the input capacitors 604.20 are coupled during the pre-gain mode, charges are distributed between the DAC capacitors 604.30 and the input capacitors 604.20 during the pre-gain mode. This may further reduce gain settling time during gain mode.

When channel 604 operates in the gain mode, switch 612.10 is disengaged while switches 612.20, 612.30 are engaged so that channel 604 is disengaged from the input signal $V_{k-1}$ while channel 604 is coupled to amplifier 602. Thus, the input capacitors 604.20, DAC capacitors 604.30, and feedback capacitors 604.40 may form an MDAC stage. In one embodiment, at the beginning of the gain mode, the summing node of the amplifier 602 may be reset to a reference such as the ground of 0V. This reset process is very short since the summing node is already very near 0V due to the high gain of amplifier 602. In an alternative embodiment, when the gain of the amplifier is high enough, the reset process may be skipped. After the short reset of the amplifier 602, charges may be transferred from the input capacitors 604.20 to the feedback capacitors 604.40 during gain settling. The gain settling process is shorter and more linear (or smoother) because a large portion of charge redistribution such as those between the input capacitors and DAC capacitors is already carried out during the previous pre-gain mode. Non-linear settling is primarily caused by MOSFET switches transitioning through different operational regions when the input is shorted and switches are engaged. Present invention allows the transitions between operational regions to occur during the pre-gain mode. Thus, during the subsequent gain mode, MDAC settling may be much more linear since the MOSFET switches are already solidly in the triode region of the MOSFET switches without the need for transitioning. Thus, the present invention may allow more time for amplifier settling, comparator regeneration, and switch driving. All of these increase the speed and reduce power consumption for the MDAC stage.

In one embodiment of the present invention, channel 604 may also operate during a reset mode. During the reset mode, channel 604 may be disengaged from the input signal $V_{k-1}$ and from amplifier 602 so that the comparator in flash 604.10 and DAC capacitors 604.30 may be reset during the reset mode.

Although the above was discussed in the context of channel 604, other channels 606, 608, 610 may operate similarly in an interleaving manner. Thus, the MDAC 600 may sequentially provide one of the residual output signals $V_{k1}$, $V_{k2}$, $V_{k3}$, $V_{k4}$ for the following MDAC stage.

Figure 7A:
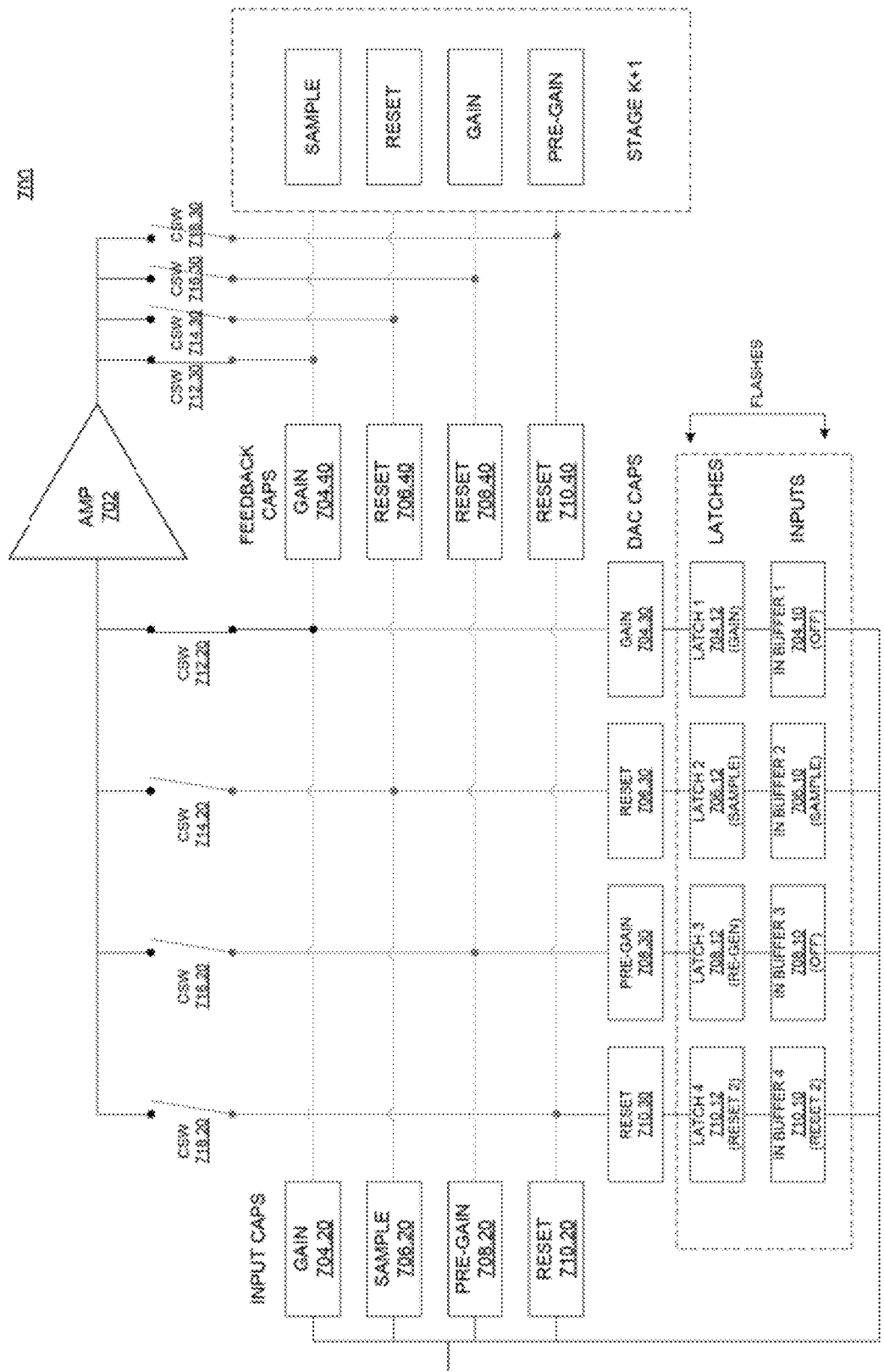
FIGS. 7A-7D illustrate an MDAC stage of a pipeline ADC at different modes of operation according to exemplary embodiments of the present invention.

FIGS. 7A-7D illustrate an MDAC stage schematic showing channels operating in different modes according to exemplary embodiments of the present invention. Referring to FIG. 7A, FIG. 7A illustrates an exemplary MDAC 700 during a clock cycle as shown in FIG. 8 in which channels 1 to 4 are respectively in gain, sample, pre-gain, and reset modes. The MDAC 700 may include an amplifier 702 and four channels among which channel 1 may include a flash input buffer 704.10, a latch 704.12, input capacitors 704.20, DAC capacitors 704.30, and feedback capacitors 704.40; channel 2 may include a flash input buffer 706.10, a latch 706.12, input capacitors 706.20, DAC capacitors 706.30, and feedback capacitors 706.40; channel 3 may include a flash input buffer 708.10, a latch 708.12, input capacitors 708.20, DAC capacitors 708.30, and feedback capacitors 708.40; channel 4 may include a flash input buffer 710.10, a latch 710.12, input capacitors 710.20, DAC capacitors 710.30, and feedback capacitors 710.40. Channels 1 to 4 may be respectively coupled to (or decoupled from) the amplifier via switch pairs 712.20/712.30, 714.20/714.30, 716.20/716.30, 718.20/718.30. Since FIG. 7A represents a clock cycle during which channel 1 is in gain mode, the pair of switches 712.20/712.30 are both engaged, and capacitors in channel 1 are coupled to the amplifier 702. Channel 2 is in sample mode and is decoupled from the amplifier 702. Thus, its input capacitors 706.20 and the input buffer 706.10 in its flash are connected to the input signal $V_{k-1}$ while its DAC capacitors 706.30 and feedback capacitors 706.04 are being reset. Channel 3 is in pre-gain mode and is decoupled from the amplifier. Thus, the input buffer 708.10 is decoupled from the input signal $V_{k-1}$. However, the latch 708.12 may enter regeneration process, and the DAC capacitors 708.30 and the input capacitors 708.20 may be connected so that charge may be distributed between the DAC capacitors 708.30 and the input capacitors 708.20 before a following gain mode. Channel 4 is in the reset mode and is decoupled both from the amplifier 702 and the input signal $V_{k-1}$. During the reset mode, capacitors in channel 4 may be reset. The output of the MDAC stage may be provided to a following MDAC stage during the gain mode for pipelined processing.

Figure 7B:
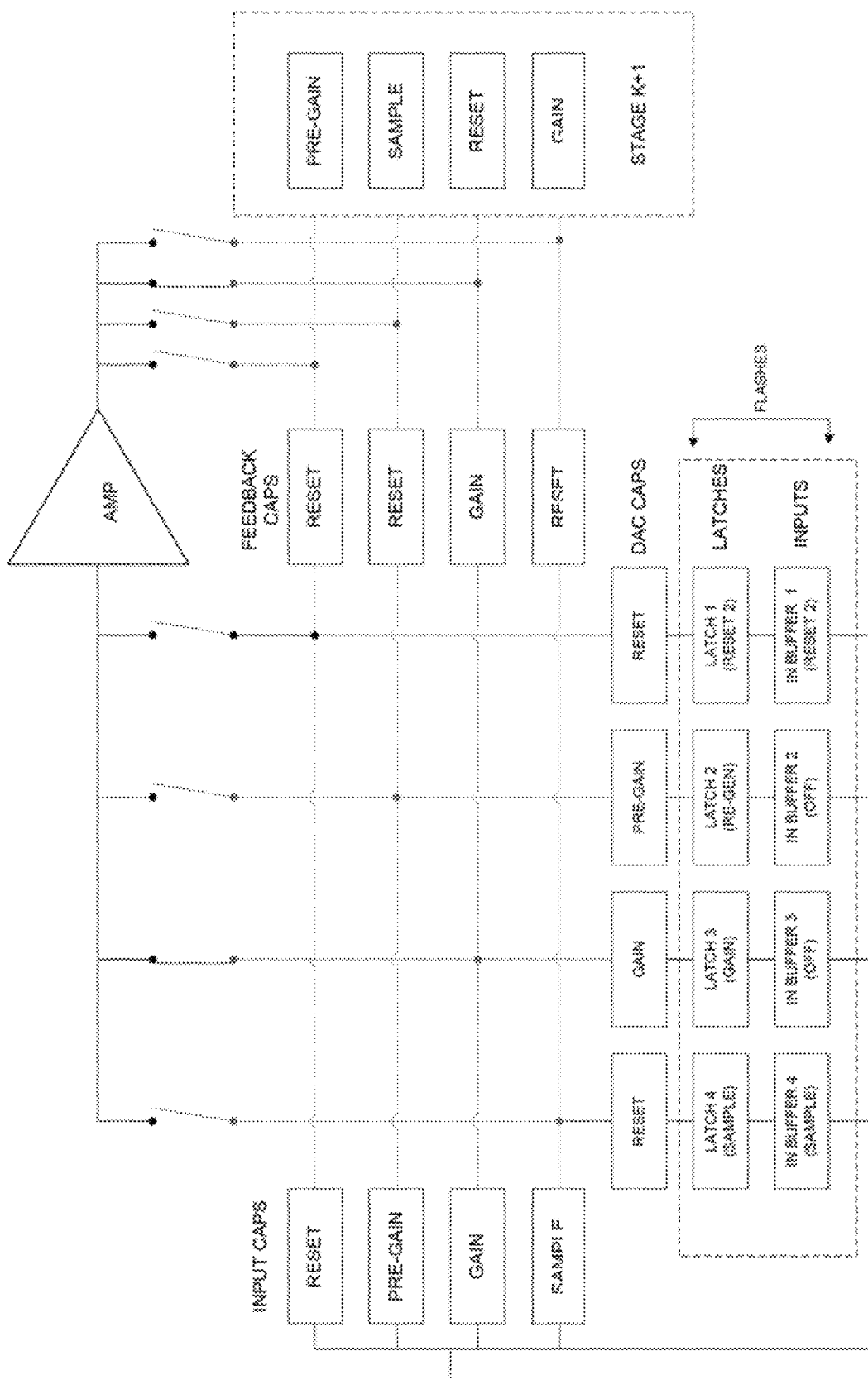
Figure 7C:
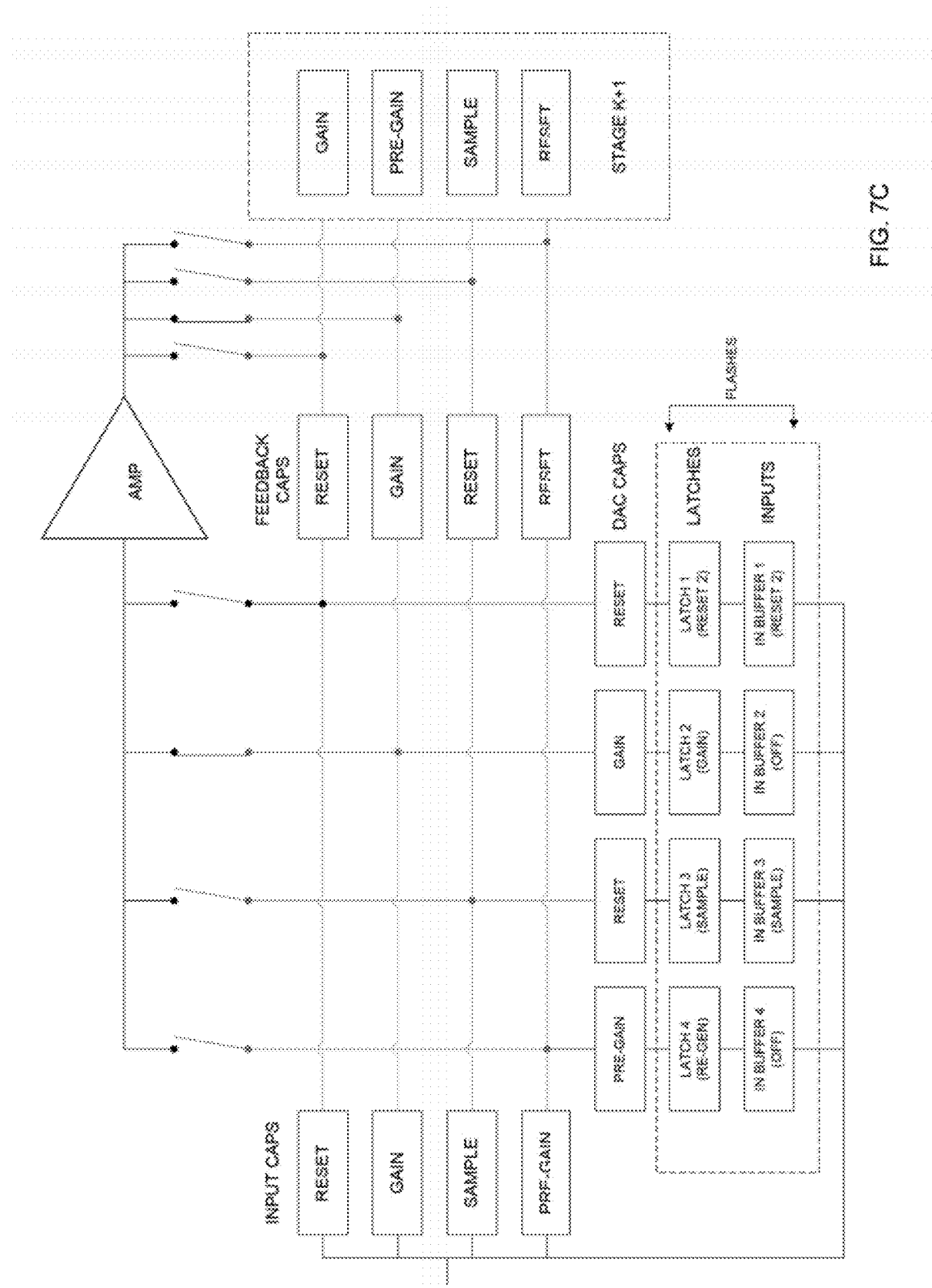
Figure 7D:
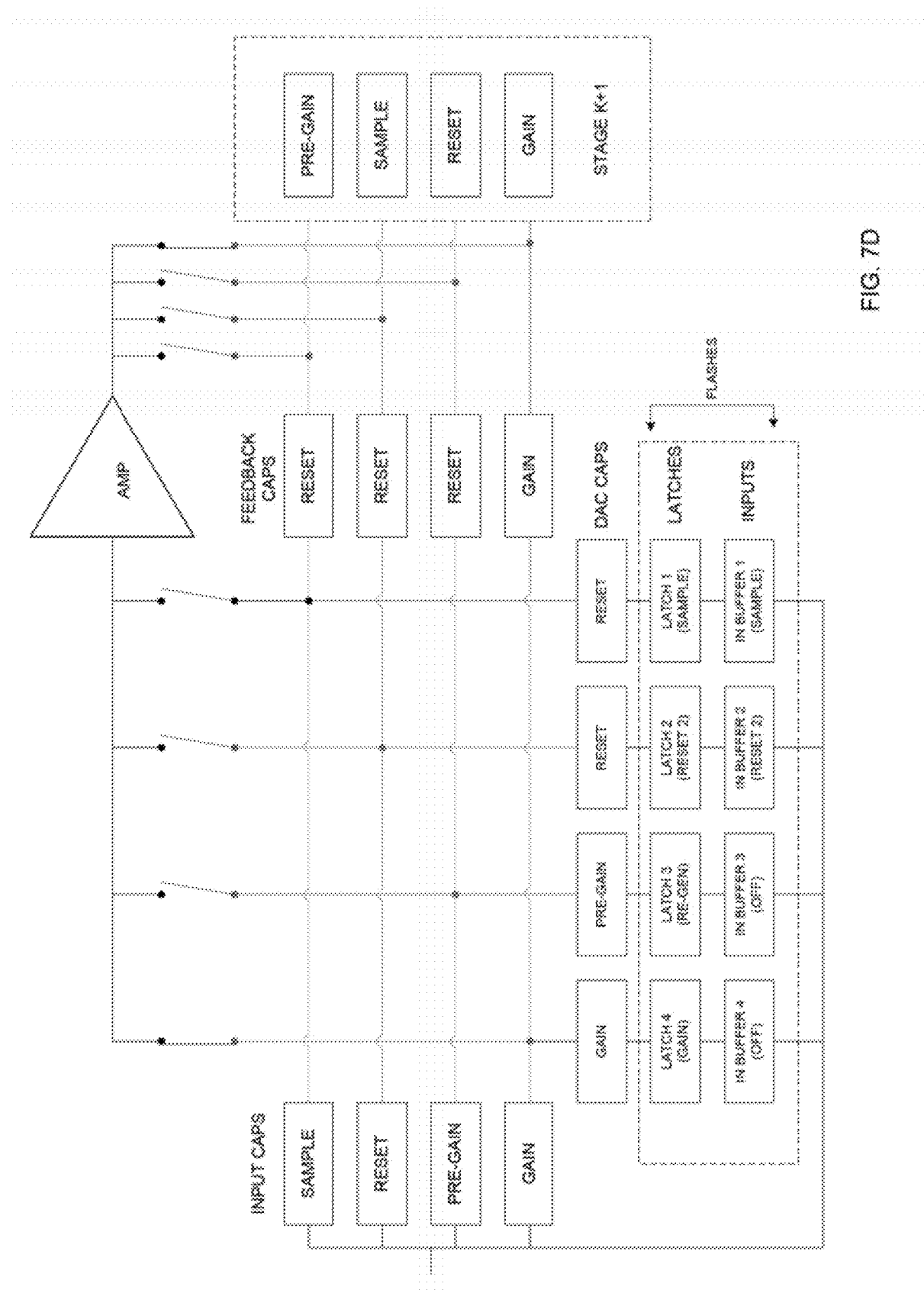

Similarly, FIG. 7B shows the MDAC in a subsequent clock cycle (as shown in FIG. 8) that channel 1 is in the reset mode, channel 2 is in the pre-gain mode, channel 3 is in the gain mode, and channel 4 is in the sample mode. FIG. 7C shows the MDAC in another subsequent clock cycle (as shown in FIG. 8) that channel 1 is in the reset mode, channel 2 is in the gain mode, channel 3 is in the sample mode, and channel 4 is in the pre-gain mode. FIG. 7D shows the MDAC in another subsequent clock cycle (as shown in FIG. 8) that channel 1 is in the sample mode, channel 2 is in the reset mode, channel 3 is in the pre-gain mode, and channel 4 is in the gain mode.

While FIG. 8 illustrates an exemplary embodiment in which the modes are randomized, the present invention is not limited to randomized modes. In an alternative embodiment, channels 1 to 4 may run under various, non-randomized sequences of modes. These non-randomized sequences may be used for debugging purposes.

Figure 9:
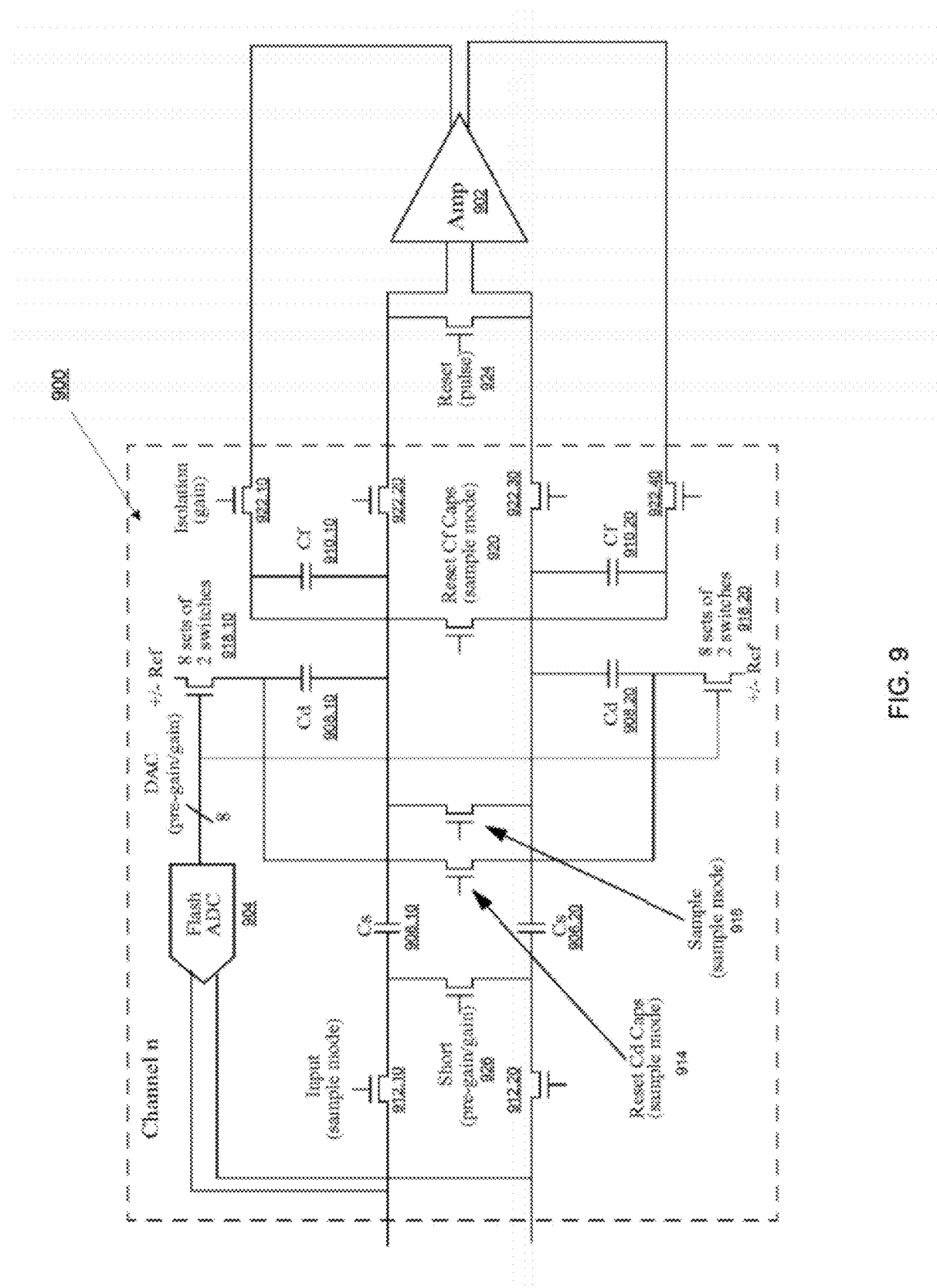
FIG. 9 illustrates an exemplary circuit of an MDAC stage according to an embodiment of the present invention.

FIG. 9 illustrates an exemplary circuit of an MDAC stage according to an embodiment of the present invention. FIG. 9 illustrates a circuit block of one channel. However, circuit blocks of other channels are similar and may be coupled to the illustrated channel in parallel. A common differential amplifier 902 may be selectively coupled to one of the channels. Within the illustrated channel 900, the circuit block may include a 3-bit flash ADC 904, capacitors 906.10, 906.20, 908.10, 908.20, 910.10, 910.20, and switches 912.10, 912.20, 914, 916, 918.10, 918.20, 920, 922.10 to 922.40, 924, and 926. Capacitors 906.10, 906.20 are input capacitors that receive input signals. Capacitors 908.10, 908.20 are DAC capacitors. Capacitors 910.10, 910.20 are feedback capacitors. These switches are controllable so that they may be selectively engaged to transition the circuit block into one of a sample, pre-gain, gain, and reset modes.

During the sample mode, switches 912.10, 912.20, 916 may be engaged so that input capacitors 906.10, 906.20 may be charged with the input signal. Also during the sample mode, switches 914, 920 may be engaged so that DAC capacitors 908.10, 908.20 and feedback capacitors 910.10, 910.20 may be reset. During the sample mode, all other switches are disengaged. Thus, the channel is decoupled from the amplifier 902.

During the pre-gain mode, switch sets 918.10, 918.20 may be engaged so that DAC capacitors 908.10, 908.20 may be charged. Since the 3-bit flash has 8 outputs, each switch sets 918.10, 918.20 may include eight switches. Further, switch 926 may be engaged so that the charge on the input capacitors 906.10, 906.20 and DAC capacitors may be distributed during the pre-gain mode. During the pre-gain mode, all other switches are disengaged. Thus, the channel is decoupled from the amplifier 902.

Switch 924 may be engaged briefly with a pulse to reset the amplifier 902 at the beginning of every gain mode of each channel. Subsequent to the quick reset of the amplifier 902, switches 922.10 to 922.40 may be engaged so that the feedback capacitors 910.10, 910.20 may be coupled to the amplifier 902 and the charge that stored in the input capacitors 906.10, 906.20 may be transferred to the feedback capacitors 910.10, 910.20. Since the charge has been pre-distributed between the DAC capacitors 908.10, 908.20 and the input capacitors 906.10, 906.20, the transition to gain settling during gain mode is more linear and faster. In an alternative embodiment of the present invention, a reset clamp switch (not shown) may be coupled to the output node of the amplifier 902. The coupling of the output reset clamp switch may be in sync with the timing of switch 924 to achieve even more linear settling for the amplifier 902.

The present invention includes many embodiments to achieve the object of maximizing the gain phase without increasing the size and power consumption of the amplifier. Embodiments of the present invention may include variable numbers of channels and correspondingly, variable modes. For example, the MDAC may include more than four or less than four channels. In one exemplary embodiment of the present invention, each channel of the MDAC stage may operate in more than one pre-gain mode during one analog-to-digital conversion cycle. Each additional pre-gain mode may correspond to one additional channel so that the channels may still be randomized. For example, if each channel operates under a sequence of a sample mode, two pre-gain modes, a gain mode, and a reset mode, there may be total of five channels connected to the single amplifier of the MDAC stage.

In one embodiment of the present invention, the MDAC may omit the reset mode and include only three channels that each respectively operates under one of the sample mode, pre-gain mode, and gain mode. Thus, the reset mode is eliminated in this embodiment. However, this embodiment still has the advantages of roughly continuous loads at the ADC input and more regeneration time for the flashes over the two-phase approach of current art.

Figure 10:
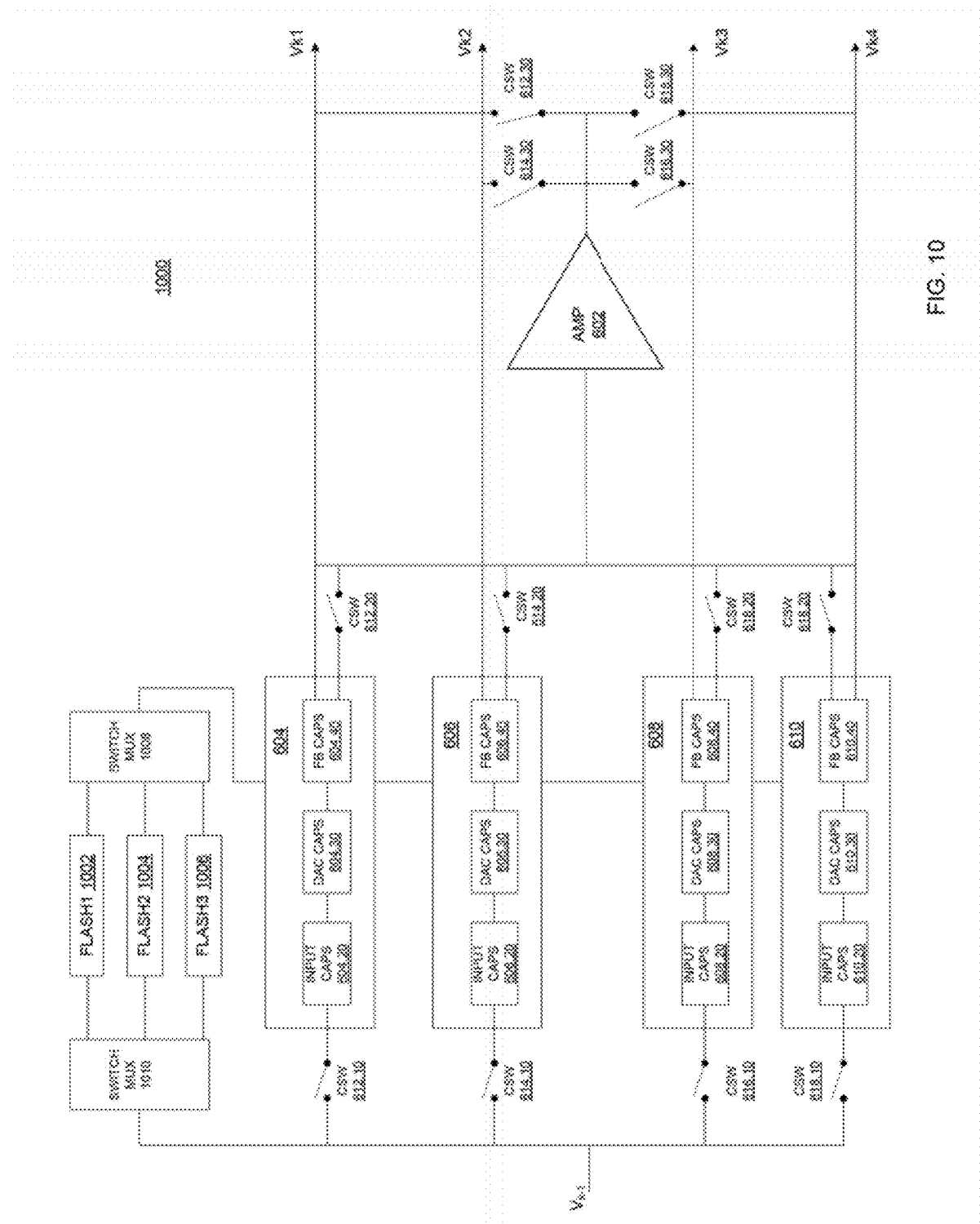
FIG. 10 illustrates an exemplary circuit of an MDAC stage having independent flashes according to an exemplary embodiment of the present invention.

In one embodiment of the present invention, the MDAC may include flashes that are independent from the channels. FIG. 10 illustrates an exemplary circuit of an MDAC stage having independent flashes according to an exemplary embodiment of the present invention.

Similar to FIG. 6, the MDAC stage as shown in FIG. 10 may include four channels 604, 606, 608, 610 all connected to an amplifier 602 via switches 612.20, 614.20, 616.20, 610.20. Each channel may include input capacitors, DAC capacitors, and feedback capacitors. However, unlike FIG. 6, the channels as shown in FIG. 10 do not include flashes. Instead, three independent flashes 1002, 1004, 1006 may be connected to the four channels via switching multiplexers 1008, 1010 that may connect any one of the flashes to any one of the four channels. Thus, in operation, the four channels may operate respectively in one of a sample mode, a pre-gain mode, a gain mode, and a reset mode. One of the three flashes 1002, 1004, 1006 may be coupled to the channel operating in the sample mode via selectively engaging switches contained in multiplexers 1008, 1010. For convenience, assume that the one of the three flashes is flash 1002 and the channel is channel 604. Flash 1002 may stay connected with the channel 604 in the subsequent pre-gain mode to charge the feedback capacitors within channel 604. After the charging, flash 1002 may be reset and available for next channel in the sample mode. In this way, each channel operating under the sample mode may select from one of two available flashes to randomize the selection of flash 1002, 1004, 1006.

Figure 11:
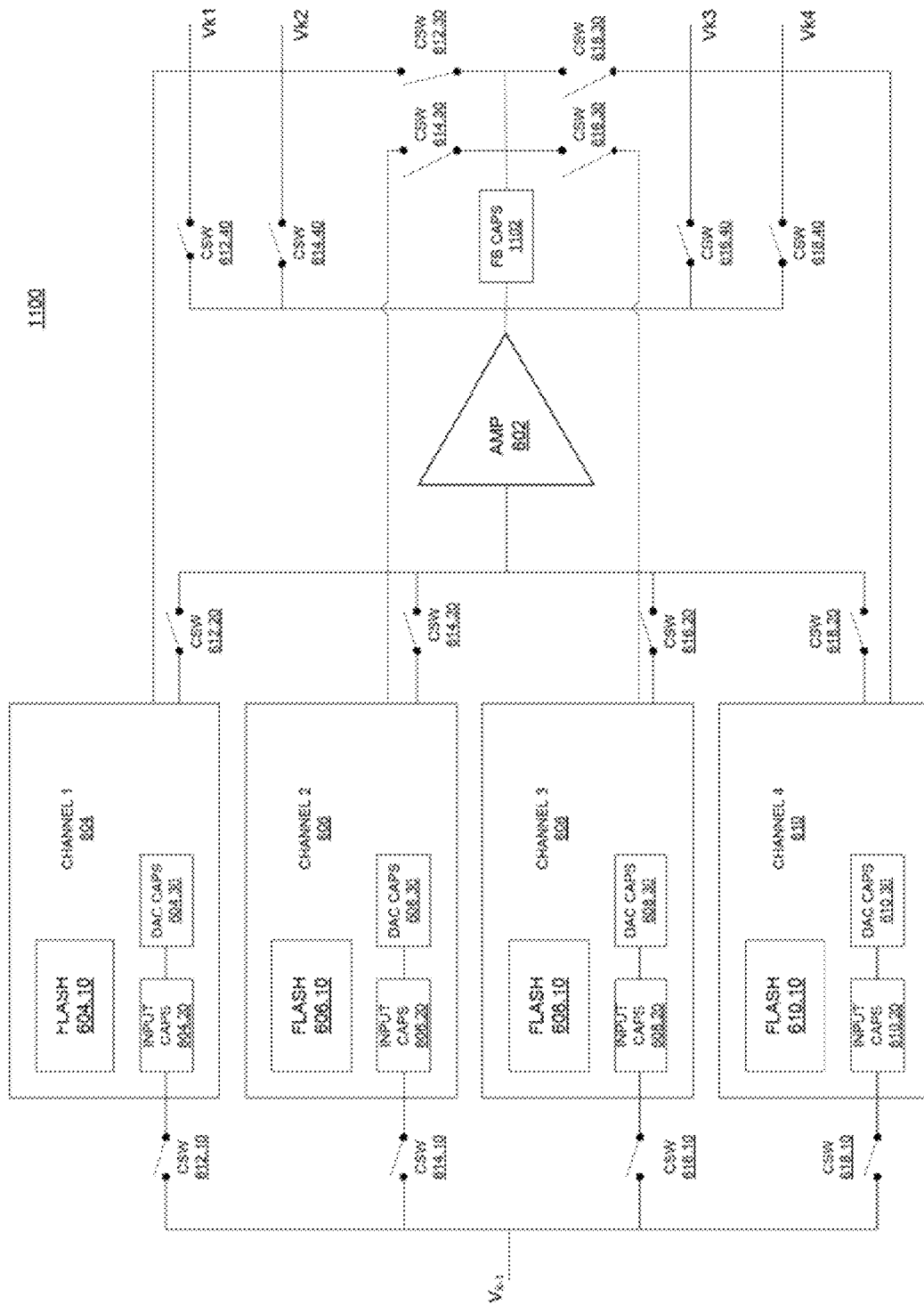
FIG. 11 illustrates an exemplary circuit of an MDAC stage having a shared feedback capacitor according to an exemplary embodiment of the present invention.

In one embodiment of the present invention, channels of MDAC may share a common feedback capacitor. FIG. 11 illustrates an exemplary circuit of an MDAC stage having a shared feedback capacitor according to an exemplary embodiment of the present invention. Referring to FIG. 11, each channel as shown in FIG. 6 may include their respective flashes, input capacitors, and DAC capacitors. However, all four channels may share a single feedback capacitor 1102 switchably coupled to the amplifier 602 via switch pairs (612.30, 612.40), (614.30, 614.40), (616.30, 616.40), (618.30, 618.40). Using the same sequence of clock cycles as shown in FIGS. 7A to 7D, at 7A, for channel 1 operating under the gain mode, switch 612.10 may be disengaged, while switch 612.20 and the switch pair (612.30, 612.40) may be engaged. Thus, the voltage charge stored in input capacitors 604.20 and DAC capacitors 604.30 may be transferred to the feedback capacitor 1102 to produce an output $V_{k1}$. For channel 2 operating under the sample mode, switch 614.10 may be engaged while switch 614.20 and the switch pair (614.30, 614.40) may be disengaged. Thus, input capacitors 606.20 may sample input $V_{k-1}$ while DAC capacitors 606.30 may be reset. For channel 3 operating under the pre-gain mode, both switches 616.10, 616.20, and the switch pair (616.30, 616.40) may be disengaged. Thus, DAC capacitors 608.30 may be coupled to input capacitors 608.20 so that DAC capacitors 608.30 may be charged from the input capacitors 608.20. For channel 4 operating under reset mode, both switches 618.10, 618.20 and the switch pair (618.30, 618.40) may be disengaged. Thus, both input capacitors 610.20 and DAC capacitors 610.30 may be reset. Similarly, the channels may cycle through 7B to 7D. At the beginning of each gain mode, the feedback capacitor 1102 may be briefly reset.

Figure 12:
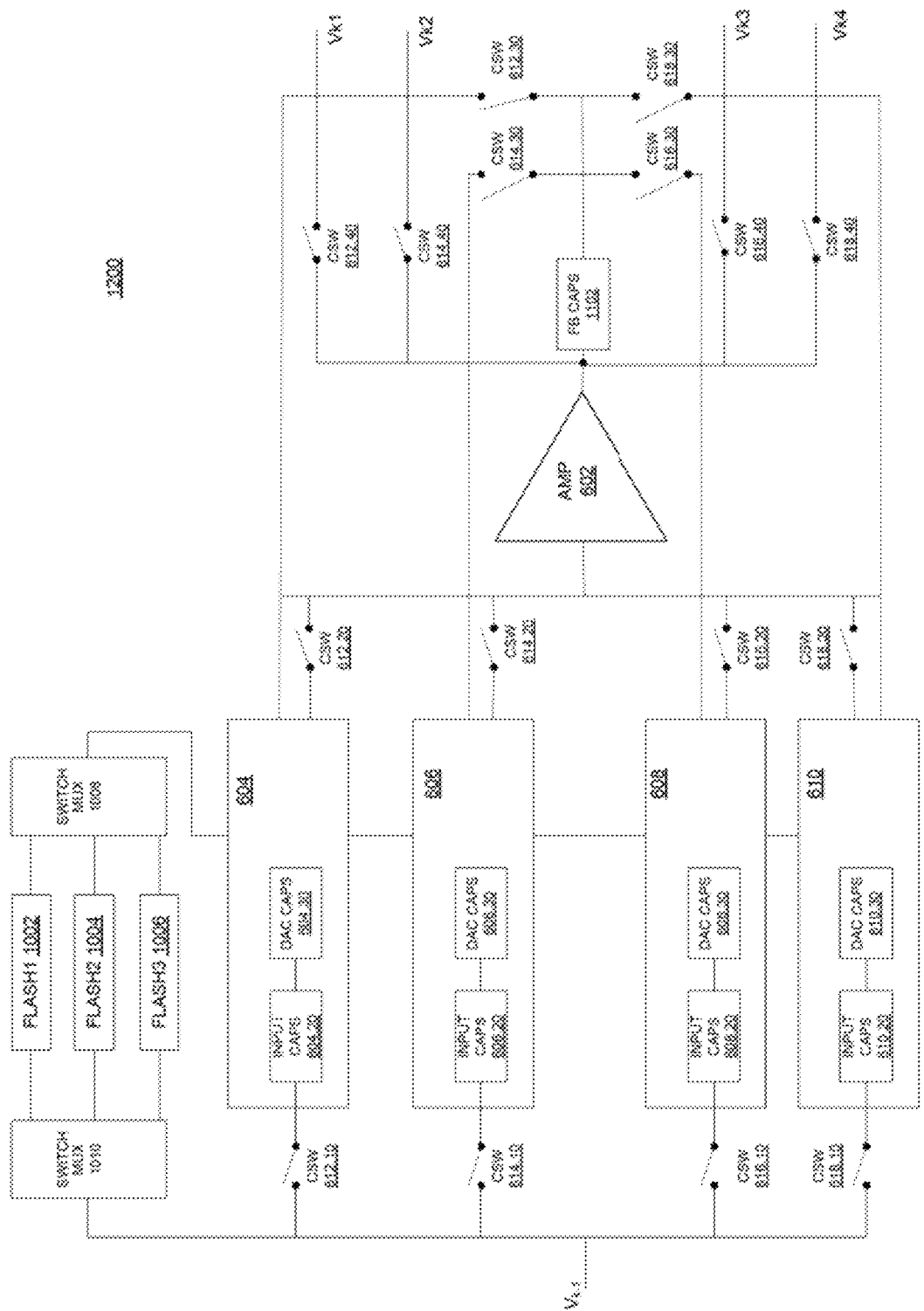
FIG. 12 illustrates an exemplary circuit of an MDAC stage having independent flashes and a share feedback capacitor according to an exemplary embodiment of the present invention.

Similarly, the embodiment as shown in FIG. 10 may also be modified so that all channels share a single feedback capacitor. FIG. 12 illustrates an exemplary circuit of an MDAC stage having independent flashes and a share feedback capacitor according to an exemplary embodiment of the present invention. As discussed in conjunction with FIG. 10, flashes 1002 to 1006 may be sequentially or randomly coupled to the channels via multiplexers 1008, 1010. At the same time, the four channels may operate as described in FIG. 11 during the sample mode, pre-gain mode, gain mode, or reset mode.

In one embodiment of the present invention, the MDAC may include only three channels and three independent flashes. The three channels may respectively operate in one of a sample mode, a pre-gain mode, and a gain mode. Thus, the reset mode is omitted. The three channels may also arranged with independent flashes and/or a shared feedback capacitor similar to embodiments as shown in FIGS. 10 to 12.

MDAC stages may be connected in various manners. In one exemplary embodiment of the present invention, channel connections between stages may be matched. Thus, channels 1 to 4 of an MDAC stage may be respectively connected to channels 1 to 4 of a subsequent MDAC stage. In an alternative exemplary embodiment of the present invention, the channel connections between MDAC stages may be independent. Thus, channels 1 to 4 of an MDAC stage may be, via switches, connected to any one of channels 1 to 4 in a subsequent MDAC stage.

Also, MDAC stages within a pipelined ADC may be a mixture of different types. For example, the pipeline ADC may include a combination of four-channel, three-channel, independent flash, and/or shared feedback capacitor types of MDAC stages as discussed above.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An analog-to-digital converter (ADC), comprising:
a plurality of sequentially cascaded stages, each stage including:
an amplifier including an input and an output; and
four copies of a circuit block, each copy of the circuit block including a flash and capacitors,
wherein, for a clock cycle that drives the ADC,
the four copies of the circuit block operate interleavingly in a respective sample mode, pre-gain mode, gain mode, and reset mode of the circuit block,
the copies of the circuit block in the sample mode, pre-gain mode, and reset mode are decoupled from the amplifier, and
the copy of the circuit block in the gain mode is coupled to the amplifier to produce an output signal for a following stage.

2. The ADC of claim 1, wherein, for the clock cycle, the circuit block in the sample mode receives an input signal that is supplied to a first capacitor to charge the first capacitor with the input signal and to charge an input buffer of the flash of the circuit block in the sample mode.

3. The ADC of claim 2, wherein the circuit block in the pre-gain mode regenerates a comparator in the flash, drives a second capacitor in a digital-to-analog converter (DAC) based on an output of the comparator, and distributes voltage charges between the first and second capacitors of the circuit block in the pre-gain mode.

4. The ADC of claim 3, wherein a first end of a third capacitor is coupled to the input of the amplifier and a second end of the third capacitor is coupled to the output of the amplifier, a common node of the first capacitor and second capacitor is coupled to the input of the amplifier to transfer a charge from the first and second capacitors to the third capacitor of the circuit block in the gain mode, and the input of the amplifier is reset prior to the transferring of the charge.

5. The ADC of claim 4, wherein the circuit block in the reset mode resets the comparator of the flash of the circuit block in the reset mode.

6. The ADC of claim 4, wherein the four copies of the circuit block shares the third capacitor.

7. The ADC of claim 4, wherein each of the four copies of the circuit block includes a separate third capacitor.

8. The ADC of claim 1, wherein each copy of the circuit block operates sequentially in an order of a sample mode, a pre-gain mode, and a gain mode.

9. The ADC of claim 8, wherein each copy of the circuit block operates a number of reset modes after the gain mode, wherein the number is randomized.

10. The ADC of claim 4, wherein, for the clock cycle,
the second capacitor in the sample mode and reset mode are reset, and
the third capacitor in the sample mode, pre-gain mode, and reset mode are reset.

11. The ADC of claim 1, wherein each stage further includes a plurality of switches that are selectively engaged to couple the circuit block in the gain mode to the amplifier.

12. The ADC of claim 1, wherein each stage receives an input signal and generates a digital code at a first output and a residual signal at a second output.

13. The ADC of claim 12, further comprising a control and correction circuit for receiving the digital code.

14. The ADC of claim 12, wherein a following stage receives the residual signal for further processing.

15. A multiplying digital-to-analog converter (MDAC) stage in a pipelined analog-to-digital converter (ADC), comprising:
an amplifier including an input and an output; and
four copies of a circuit block, each copy of the circuit block including a flash and capacitors,
wherein, for a clock cycle that drives the ADC,
the four copies of the circuit block operate interleavingly in a respective sample mode, pre-gain mode, gain mode, and reset mode of the circuit block,
the copies of the circuit block in the sample mode, pre-gain mode, and reset mode are decoupled from the amplifier, and
the copy of the circuit block in the gain mode is coupled to the amplifier to produce an output signal for a following stage.

16. The MDAC stage of claim 15, wherein, for the clock cycle, the circuit block in the sample mode receives an input signal that is supplied to a first capacitor to charge the first capacitor with the input signal and to charge an input buffer of the flash of the circuit block in the sample mode.

17. The MDAC stage of claim 16, wherein the circuit block in the pre-gain mode regenerates a comparator in the flash, drives a second capacitor in a digital-to-analog converter (DAC) based on an output of the comparator, and distributes voltage charges between the first and second capacitors of the circuit block in the pre-gain mode.

18. The MDAC stage of claim 17, wherein a first end of a third capacitor is coupled to the input of the amplifier and a second end of the third capacitor is coupled to the output of the amplifier, a common node of the first capacitor and second capacitor is coupled to the input of the amplifier to transfer a charge from the first and second capacitors to the third capacitor of the circuit block in the gain mode, and the input of the amplifier is reset prior to the transferring of the charge.

19. The MDAC stage of claim 18, wherein the circuit block in the reset mode resets the comparator of the flash of the circuit block in the reset mode.

20. A multiplying digital-to-analog converter (MDAC) stage in a pipelined analog-to-digital converter (ADC), comprising:
an amplifier including an input and an output; and
three copies of a circuit block, each copy of the circuit block including a flash and capacitors,
wherein, for a clock cycle that drives the ADC,
the three copies of the circuit block operate interleavingly in a respective sample mode, pre-gain mode, and gain mode of the circuit block,
the copies of the circuit block in the sample mode and pre-gain mode are decoupled from the amplifier, and
the copy of the circuit block in the gain mode is coupled to the amplifier to produce an output signal for a following stage.

21. A multiplying digital-to-analog converter (MDAC) stage in a pipelined analog-to-digital converter (ADC), comprising:
an amplifier including an input and an output;
four copies of a circuit block, each copy of the circuit block including capacitors; and
three flashes,
wherein, for a clock cycle that drives the ADC,
the four copies of the circuit block operate interleavingly in a respective sample mode, pre-gain mode, gain mode, and reset mode of the circuit block,
the copies of the circuit block in the sample mode, pre-gain mode, and reset mode are decoupled from the amplifier,
the copy of the circuit block in the gain mode is coupled to the amplifier to produce an output signal for a following stage, and
one of the three flashes is connected to the channel in the sample mode and stays connected during the pre-gain mode.

22. A multiplying digital-to-analog converter (MDAC) stage in a pipelined analog-to-digital converter (ADC), comprising:
an amplifier including an input and an output;
three copies of a circuit block, each copy of the circuit block including capacitors; and
three flashes,
wherein, for a clock cycle that drives the ADC,
the three copies of the circuit block operate interleavingly in a respective sample mode, pre-gain mode, and gain mode of the circuit block,
the copies of the circuit block in the sample mode and pre-gain mode are decoupled from the amplifier,
the copy of the circuit block in the gain mode is coupled to the amplifier to produce an output signal for a following stage, and
one of the three flashes is connected to the channel in the sample mode and stays connected during the pre-gain mode.

* * * * *